United States Patent
Miyazaki et al.

(10) Patent No.: US 11,642,938 B2
(45) Date of Patent: May 9, 2023

(54) RECORDING DEVICE FOR RAILROAD VEHICLE, AIR CONDITIONING DEVICE FOR RAILROAD VEHICLE, AND RECORDING METHOD FOR RAILROAD VEHICLE

(71) Applicant: Mitsubishi Electric Corporation, Tokyo (JP)

(72) Inventors: Yasuyuki Miyazaki, Tokyo (JP); Koichi Harada, Kobe (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 403 days.

(21) Appl. No.: 16/634,257

(22) PCT Filed: Dec. 8, 2017

(86) PCT No.: PCT/JP2017/044257
§ 371 (c)(1),
(2) Date: Jan. 27, 2020

(87) PCT Pub. No.: WO2019/082401
PCT Pub. Date: May 2, 2019

(65) Prior Publication Data
US 2020/0369120 A1    Nov. 26, 2020

(30) Foreign Application Priority Data
Oct. 23, 2017    (JP) .............................. JP2017-204453

(51) Int. Cl.
*B60H 1/00* (2006.01)
*B61D 27/00* (2006.01)
*G11C 7/10* (2006.01)

(52) U.S. Cl.
CPC ..... *B60H 1/00978* (2013.01); *B61D 27/0018* (2013.01); *G11C 7/1096* (2013.01)

(58) Field of Classification Search
CPC .............. B60H 1/00978; G11C 7/1096; B61D 27/0018
See application file for complete search history.

(56) References Cited

U.S. PATENT DOCUMENTS

| 5,442,777 A * | 8/1995 | Nakajima ........... G06F 11/3466 714/E11.2 |
| 2005/0200989 A1* | 9/2005 | Goto .................... G11B 27/034 360/13 |

(Continued)

FOREIGN PATENT DOCUMENTS

| JP | 2005121302 A | 5/2005 |
| JP | 2007020343 A | 1/2007 |

(Continued)

OTHER PUBLICATIONS

Office Action dated Jul. 5, 2021, issued in corresponding Chinese Patent Application No. 201780095956.6, 8 pages Including 5 pages of English translation.

(Continued)

*Primary Examiner* — Henry T Crenshaw
(74) *Attorney, Agent, or Firm* — Buchanan Ingersoll & Rooney PC

(57) ABSTRACT

A detector detects physical quantities relating to an operation of a vehicle air-conditioning device at a predetermined sampling frequency to generate groups of time-series data items. A volatile tracking memory has a work area to which the groups of time-series data items for a tracking period is writable. A record holding power accumulator supplies, to the tracking memory, power used for holding in the work area the groups of time-series data items. A writer sequentially overwrites the groups of time-series data to the work area of the tracking memory and stops overwriting of the (Continued)

groups of time-series data items to the work area when an abnormality occurs in the vehicle air-conditioning device.

4 Claims, 10 Drawing Sheets

(56) References Cited

U.S. PATENT DOCUMENTS

| | | | | |
|---|---|---|---|---|
| 2009/0157347 A1* | 6/2009 | Ishii | ................... | G05B 19/406 |
| | | | | 702/150 |
| 2010/0288482 A1* | 11/2010 | Bull | ................... | F24D 17/02 |
| | | | | 165/140 |
| 2012/0055178 A1* | 3/2012 | Takahashi | ................ | F24H 9/2007 |
| | | | | 62/189 |
| 2014/0207304 A1* | 7/2014 | Yamaguchi | ............... | H02J 3/14 |
| | | | | 700/297 |
| 2015/0143823 A1* | 5/2015 | Slack | .................. | F25D 11/006 |
| | | | | 62/3.6 |
| 2015/0362537 A1* | 12/2015 | Van Gorp | ................ | H02J 3/00 |
| | | | | 702/60 |
| 2016/0318622 A1* | 11/2016 | Haukom | .............. | G07C 5/0808 |
| 2018/0043781 A1* | 2/2018 | Kanai | ................ | G01R 31/3835 |

FOREIGN PATENT DOCUMENTS

| | | |
|---|---|---|
| JP | 2011194992 A | 10/2011 |
| JP | 2014133435 A | 7/2014 |
| JP | 2015092121 A | 5/2015 |
| JP | 2017189063 A | 10/2017 |
| RO | 122272 B1 | 3/2009 |

OTHER PUBLICATIONS

Office Action dated Oct. 29, 2020, issued in corresponding Chinese Patent Application No. 201780095956.6, 16 pages including 8 pages of English translation.

Extended European Search Report dated Nov. 2, 2020 for corresponding European Patent Application No. 17929981.3, 8 pages.

International Search Report (PCT/ISA/210), with translation, and Written Opinion (PCT/ISA/237) dated Mar. 6, 2018, by the Japan Patent Office as the International Searching Authority for International Application No. PCT/JP2017/044257.

* cited by examiner

RECORDING DEVICE FOR RAILROAD VEHICLE, AIR CONDITIONING DEVICE FOR RAILROAD VEHICLE, AND RECORDING METHOD FOR RAILROAD VEHICLE

TECHNICAL FIELD

The present disclosure relates to a recording device for a railroad vehicle, an air conditioning apparatus for the railroad vehicle, and a recording method for the railroad vehicle.

BACKGROUND ART

As disclosed in Patent Literature 1, a device that detects an operating current supplied to an air conditioner for performing air conditioning and records in a memory thereof a detection result during operation of the air conditioner is known. When an abnormality occurs in the air conditioner, data indicating the detection result of the operating current is utilized to determine the cause of the abnormality.

CITATION LIST

Patent Literature

Patent Literature 1: Unexamined Japanese Patent Application Kokai Publication No. 2005-121302

SUMMARY OF INVENTION

Technical Problem

An overhead wire is used to supply power to an air conditioner installed in a railroad vehicle. The power supplied from the overhead wire may suddenly change, and various physical quantities relating to an operation of the air conditioner are apt to change precipitously. Thus, in order to check later for the occurrence of such a precipitous change, recording of the physical quantities at a highest possible sampling frequency is desirable.

Here, employing a non-volatile memory as a memory to record time-series data indicating detection results of the physical quantities cannot achieve high-speed writing of the time-series data to the memory. Thus, recording of all of the obtained time-series data to the memory without omission cannot be achieved in employing a high sampling frequency for detection of the physical quantities.

On the other hand, employing a volatile memory as a memory to record the time-series data enables high-speed writing. However, a memory in a railroad vehicle needs to be supplied power from the overhead wire, and interruption or stoppage of power supply from the overhead wire leads to disappearance of the time-series data recorded in the volatile memory.

Although a case of acquiring time-series data from an air conditioner installed in a railroad vehicle is described above, the aforementioned problems may also occur in acquiring time-series data from a device, other than an air conditioner, installed in the railroad vehicle.

An objective of the present disclosure is to provide a recording device for a railroad vehicle, an air conditioning apparatus for the railroad vehicle, and a recording method for the railroad vehicle that enable recording at a high sampling frequency of physical quantities relating to an operation of a vehicle air-conditioning device that performs air conditioning of a passenger compartment of the railroad vehicle and lower a possibility of disappearance of the recorded time-series data of the physical quantities.

Solution to Problem

In order to achieve the aforementioned objective, a recording device for a railroad vehicle of the present disclosure includes:

detection means for repeatedly detecting, from a target device installed in the railroad vehicle, a physical quantity relating to an operation of the target device at a predetermined sampling frequency to generate time-series data indicating detection values of the physical quantity in time series;

abnormality detection means for detecting occurrence of an abnormality in the target device;

a tracking memory that is volatile and has a work area to which the time-series data for a predetermined tracking period is writable;

a record holding power accumulator to store power supplied from an overhead wire and to supply the stored power as record holding power to the tracking memory, the record holding power being used by the tracking memory to hold the time-series data for the tracking period in the work area; and writing means for (i) sequentially overwriting the time-series data generated by the detection means to the work area of the tracking memory to sequentially update content recorded in the work area to the time-series data for a latest tracking period and (ii) stopping overwriting of the time-series data to the work area when the abnormality detection means detects occurrence of an abnormality in the target device.

Advantageous Effects of Invention

The above-described configuration includes a volatile memory as the tracking memory, enabling the writing means to achieve a higher speed of writing of the time-series data to the tracking memory than in a case of employing a non-volatile memory as the tracking memory. Thus, exhaustive writing of the time-series data generated by the detection means to the tracking memory can be achieved when employing a high sampling frequency in detecting the physical quantities by the detection means. That is to say, recording of the physical quantities relating to an operation of the target device at a high sampling frequency can be achieved.

Furthermore, the record holding power accumulator supplying to the tracking memory power for holding records lowers the possibility of disappearance of the time-series data of the physical quantities recorded in the work area of the tracking memory even during interruption or stoppage of power supply from the overhead wire.

DESCRIPTION OF EMBODIMENTS

Figure 1:
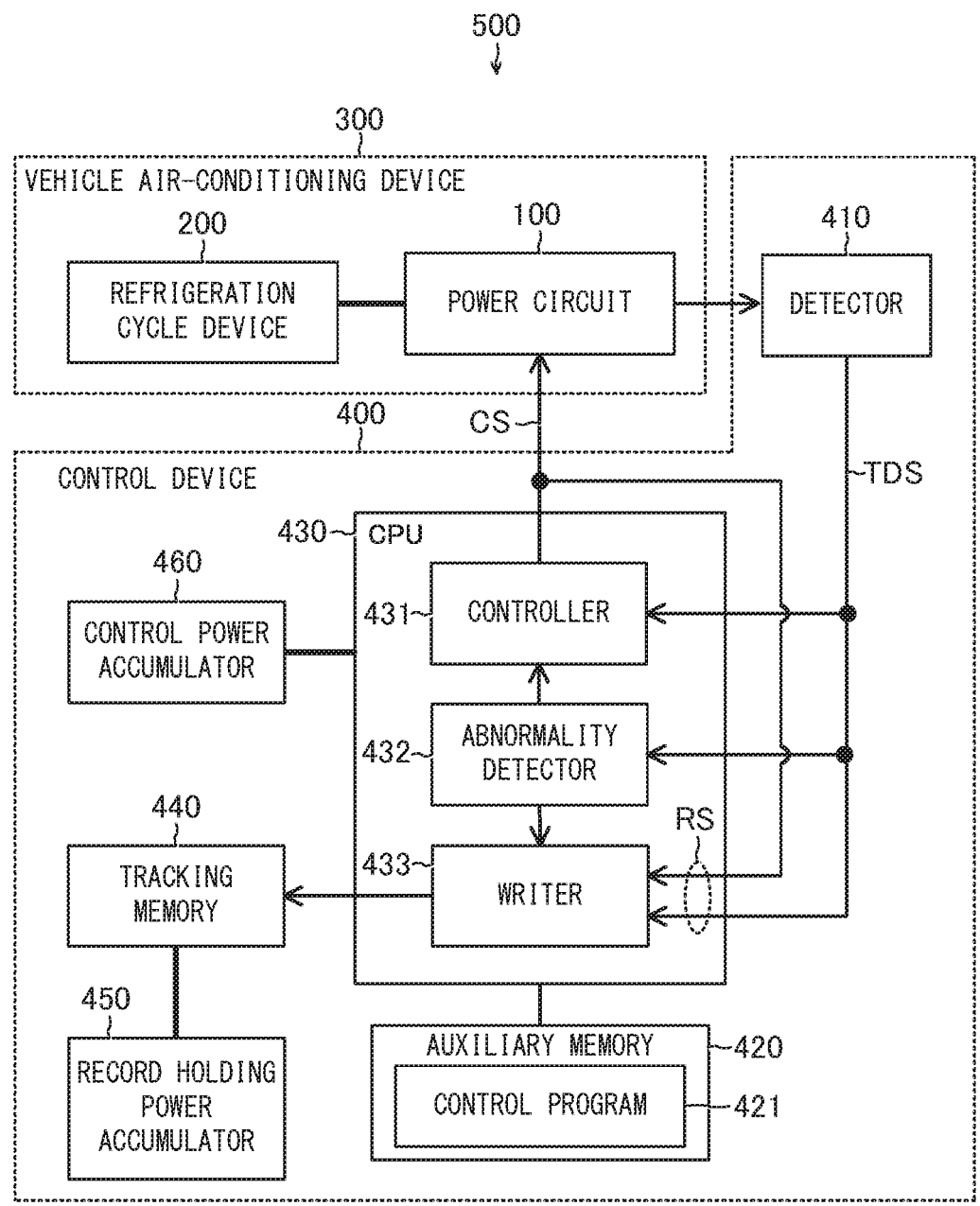
FIG. 1 is a schematic diagram illustrating a configuration of an air conditioning apparatus for a railroad vehicle according to Embodiment 1.

Hereinafter embodiments of an air conditioning apparatus for a railroad vehicle that is installed in the railroad vehicle are described with reference to the drawings. In the drawings, components having the same or corresponding configurations are denoted by the same reference numerals.

Embodiment 1

As illustrated in FIG. 1, an air conditioning apparatus 500 for a railroad vehicle according to the present embodiment includes a vehicle air-conditioning device 300 that is installed in a railroad vehicle and is a target device, and a control device 400 that controls the vehicle air-conditioning device 300. The vehicle air-conditioning device 300 includes a power circuit 100 that is electrically connected to an overhead wire and a refrigeration cycle device 200 to which power is supplied via the power circuit 100.

The refrigeration cycle device 200 provides a refrigeration cycle using a refrigerant, thereby performing air conditioning of a passenger compartment of the railroad vehicle. Controlling the power circuit 100 using the control device 400 enables an adjustment of air-conditioning performance by the refrigeration cycle device 200 of the railroad vehicle.

Hereinafter configurations of components of the air conditioning apparatus 500 are specifically described. First, a configuration of the refrigeration cycle device 200 is described with reference to FIG. 2.

Figure 2:
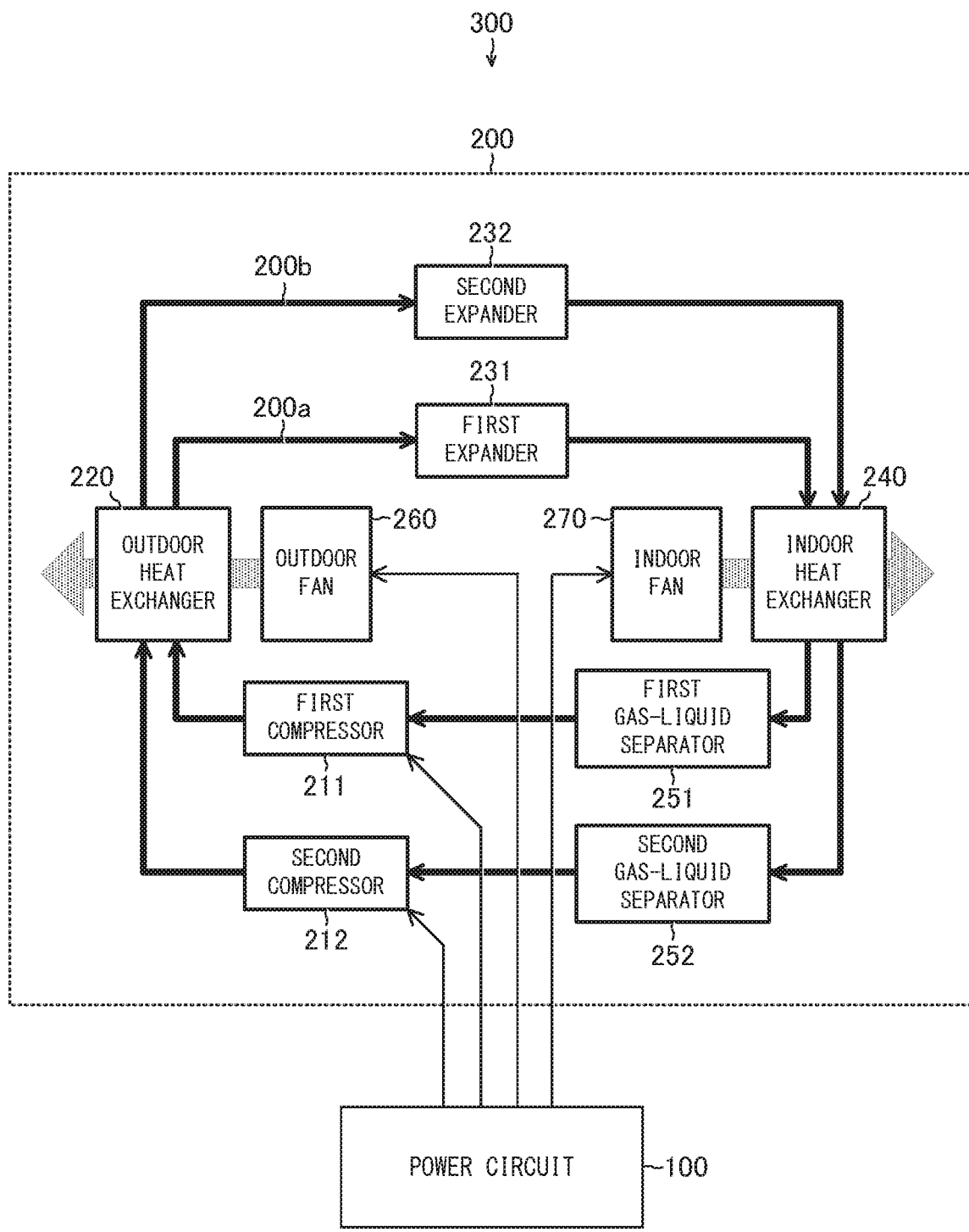
FIG. 2 is a schematic diagram illustrating a configuration of a refrigeration cycle device according to Embodiment 1.

As illustrated in FIG. 2, the refrigeration cycle device 200 provides two refrigeration cycles, that is, a first refrigeration cycle 200a and a second refrigeration cycle 200b.

The first refrigeration cycle 200a includes a first compressor 211 that compresses the refrigerant, an outdoor heat exchanger 220 that functions as a condenser for condensing the compressed refrigerant, a first expander 231 that expands the condensed refrigerant, an indoor heat exchanger 240 that functions as an evaporator for evaporating the expanded refrigerant, and a first gas-liquid separator 251 that separates gaseous refrigerant from liquid refrigerant and allows only the gaseous refrigerant to pass to the first compressor 211.

The second refrigeration cycle 200b shares the outdoor heat exchanger 220 and the indoor heat exchanger 240 with the first refrigeration cycle 200a. The second refrigeration cycle 200b includes a second compressor 212 that compresses the refrigerant, a second expander 232 that expands the refrigerant condensed by the outdoor heat exchanger 220, and a second gas-liquid separator 252 that separates liquid refrigerant from the refrigerant passing through the indoor heat exchanger 240 and allows only gaseous refrigerant to pass to the second compressor 212.

The refrigeration cycle device 200 further includes an outdoor fan 260 that discharges air exchanged with the outdoor heat exchanger 220 to the outside of the railroad vehicle, and an indoor fan 270 that blows air exchanged with the indoor heat exchanger 240 to the passenger compartment of the railroad vehicle.

The above-described power circuit 100 supplies power to the first compressor 211, the second compressor 212, the outdoor fan 260, and the indoor fan 270. Hereinafter a configuration of a part from the overhead wire to the power circuit 100 and a configuration of the power circuit 100 are specifically described with reference to FIG. 3.

Figure 3:
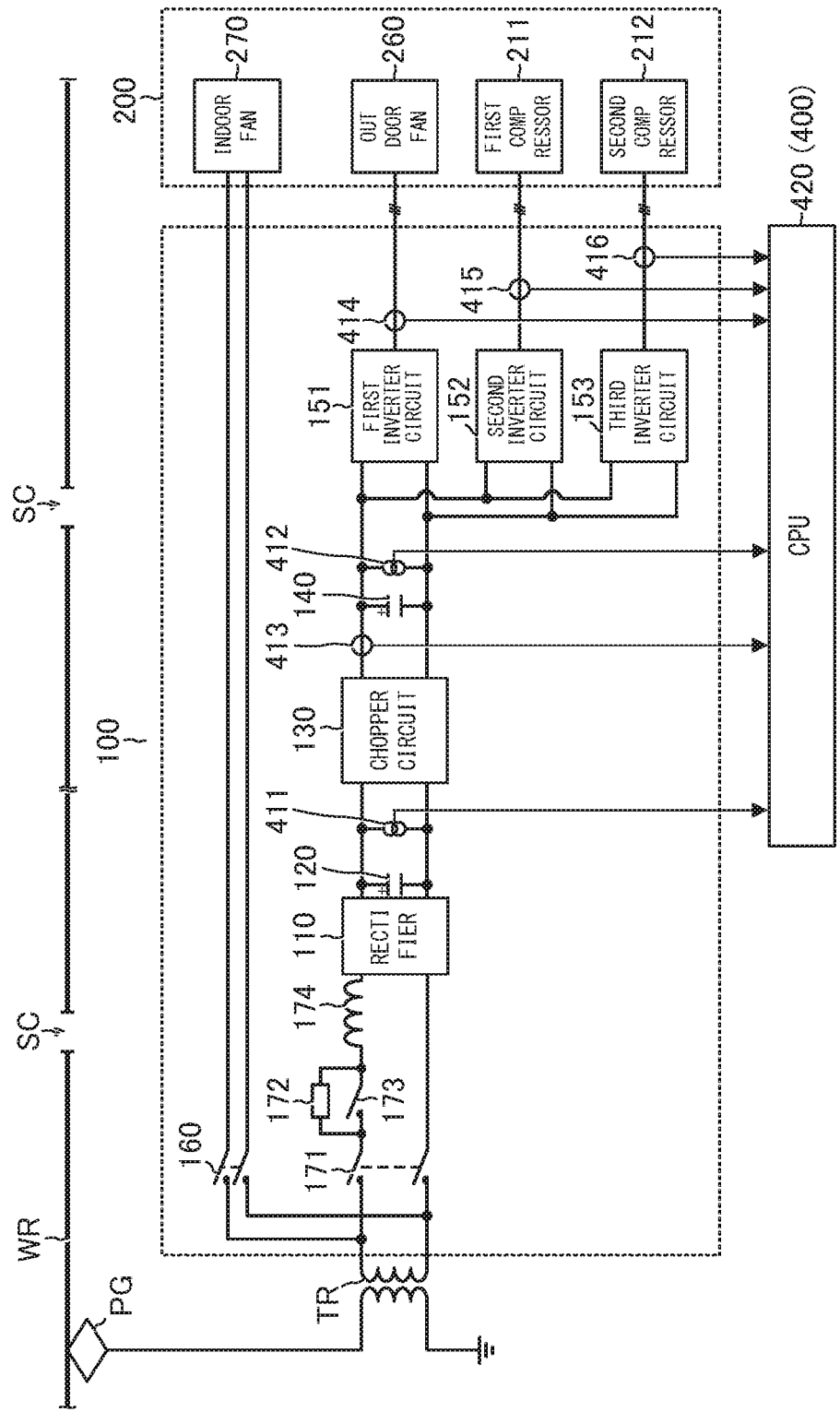
FIG. 3 is a schematic diagram illustrating a configuration of a power circuit according to Embodiment 1.

As illustrated in FIG. 3, a voltage is input into the power circuit 100 from an overhead wire WR via a pantograph PG and a transformer TR. The pantograph PG contacts the overhead wire WR. The transformer TR transforms an alternating-current voltage supplied from the overhead wire WR via the pantograph PG.

The power circuit 100 includes a rectifier 110 that converts the alternating-current voltage transformed by the transformer TR into a direct voltage, an input capacitor 120 that smooths the direct voltage output from the rectifier 110, a chopper circuit 130 that performs a chopper control to adjust an effective value of the smoothed direct voltage, and an output capacitor 140 that holds an output voltage of the chopper circuit 130.

The power circuit 100 further includes a first inverter circuit 151, a second inverter circuit 152, and a third inverter circuit 153 each convert the output voltage of the chopper circuit 130 into an alternating-current voltage. The first inverter circuit 151 to the third inverter circuit 153 are connected in parallel to one another, and thus the frequency of an output voltage of each inverter can be controlled independently.

The output voltage of the first inverter circuit 151 is supplied to the outdoor fan 260. The output voltage of the second inverter circuit 152 is supplied to the first compressor 211. The output voltage of the third inverter circuit 153 is supplied to the second compressor 212.

The power circuit 100 further includes a contactor 160 that is arranged on a transmission line for supplying the alternating-current voltage transformed by the transformer TR to the indoor fan 270. The alternating-current voltage transformed by the transformer TR is supplied to the indoor fan 270 as is without rectification.

In addition, The power circuit 100 includes, between the transformer TR and the rectifier 110, a contactor 171 that switches on and off the connection between the transformer TR and the rectifier 110, a current-limiting resistor 172 that suppresses an inrush current during charging of the input capacitor 120, a contactor 173 for bypassing the current-limiting resistor 172 after completion of charging of the input capacitor 120, and an alternating current reactor 174 that suppresses surges.

The control device 400 of FIG. 1 controls the above-described power circuit 100. Hereinafter the control device 400 is described with reference to FIGS. 1 and 3.

As illustrated in FIG. 1, the control device 400 includes a detector 410 that functions as detection means for detecting physical quantities relating to operation of the vehicle air-conditioning device 300. The detector 410 detects, as physical quantities relating to the operation of the vehicle air-conditioning device 300, internal voltages and currents of the power circuit 100.

Specifically, as illustrated in FIG. 3, the detector 410 includes a transformer 411 that transforms an input voltage of the chopper circuit 130, a transformer 412 that transforms the output voltage of the chopper circuit 130, a transformer 413 that transforms an output current of the chopper circuit 130, a transformer 414 that transforms an output current of the first inverter circuit 151, a transformer 415 that transforms an output current of the second inverter circuit 152, and a transformer 416 that transforms an output current of the third inverter circuit 153.

The detector 410 of FIG. 1, by repeatedly detecting each output of the six transformers 411-416 at a predetermined sampling frequency, outputs groups of time-series data items TDS, each including time-series data items indicating detection values of the corresponding output in time series.

That is to say, the groups of time-series data items TDS includes a group of time-series data items about the input voltage of the chopper circuit 130, a group of time-series data items about the output voltage of the chopper circuit 130, a group of time-series data items about the output current of the first inverter circuit 151, a group of time-series data items about the output current of the second inverter circuit 152, and a group of time-series data items about the output current of the third inverter circuit 153.

As illustrated in FIG. 1, the control device 400 further includes an auxiliary memory 420 that is non-volatile and stores a control program 421 defining various functions of the control device 400, and a Central Processing Unit (CPU) 430 that executes the control program 421.

The control program 421 causes the CPU 430 to achieve the function of the controller 431 that controls the power circuit 100 based on the groups of time-series data items TDS output by the detector 410 and the function of an abnormality detector 432 that functions as abnormality detection means for detecting occurrence of an abnormality in the power circuit 100 based on the groups of time-series data items TDS.

The controller 431 outputs to the power circuit 100 control orders CS to control the power circuit 100. Specifically, the controller 431 performs control for achieving an output voltage of the chopper circuit 130 of FIG. 3 close to a target value and control for achieving effective values and frequencies of the outputs from the first inverter circuit 151 to the third inverter circuit 153 close to target values.

That is to say, the control orders CS of FIG. 1 include a gate voltage signal for controlling on/off operation of a switching element included in the chopper circuit 130 of FIG. 3, and gate voltage signals for controlling on/off operation of switching elements included in the first inverter circuit 151 to the third inverter circuit 153.

Furthermore, the controller 431 of FIG. 1 controls the contactors 160, 171, and 173 of FIG. 3. That is to say, the control orders CS of FIG. 1 further include voltage signals for controlling on/off operation of the contactors 160, 171, and 173.

The abnormality detector 432 of FIG. 1 detects, based on the groups of time-series data items TDS, as occurrence of an abnormality, such as excess of a predetermined threshold value in the input voltage or in the output voltage of the chopper circuit 130 of FIG. 3, excess of a predetermined threshold value in the output currents of the first inverter circuit 151, the second inverter circuit 152, or third inverter circuit 153, and occurrence of imbalanced effective value among phases of three-phase alternating current included in each output from the first inverter circuit 151, the second inverter circuit 152, and the third inverter circuit 153.

Upon detection by the abnormality detector 432 of an abnormality in the power circuit 100, the controller 431 of FIG. 1 addresses the abnormality by switching off the contactor 171 of FIG. 3, stopping switching performed in the chopper circuit 130, or the like.

Here, in a case of occurrence of an abnormality in the power circuit 100, an investigation to determine the cause of the abnormality is desirable to explore an improvement to reduce recurrence of an abnormality similar to the abnormality. Thus, in order to achieve tracking of a process leading to an abnormality in the power circuit 100 after occurrence of the abnormality, the control device 400 of FIG. 1 also functions as a recording device for a railroad vehicle that records the groups of time-series data items TDS output by the detector 410. The function is specifically described below.

As illustrated in FIG. 1, the control device 400 includes a tracking memory 440 that records the groups of time-series data items TDS output by the detector 410 and a plurality of data items (hereinafter the plurality of data items are collectively called a group of control order data items) each indicating the control order CS of various types of control orders CS output by the controller 431.

The tracking memory 440 includes a work area to which the groups of time-series data items TDS and the groups of control order data items (hereinafter data items included in the two groups are collectively called a group of tracking data items RS) for a predetermined tracking period are writable.

The CPU 430 also functions as a writer 433 that is writing means for writing the group of tracking data items RS in the work area of the tracking memory 440. The control program 421 achieves the function of the writer 433.

The writer 433 performs sequential update processing of sequentially overwriting, during operation of the vehicle air-conditioning device 300, the data items included in the group of tracking data items RS to the work area of the tracking memory 440. This enables sequential update of the content recorded in the work area of the tracking memory 440 to the group of tracking data items RS for the latest tracking period during operation of the vehicle air-conditioning device 300.

Thus, when an abnormality occurs in the vehicle air-conditioning device 300, determination of the cause of occurrence of the abnormality can be achieved by referring to the tracking memory 440 and checking waveforms of the data items included in the groups of time-series data items TDS and the group of control order data items that are recorded in the work area.

As described above, the content recorded in the work area of the tracking memory 440 contributes to determination of the cause of occurrence of an abnormality. Accuracy of the determination of the cause of an abnormality mainly depends on a sampling frequency at which the groups of time-series data items TDS are recorded.

Here, as illustrated in FIG. 3, the overhead wire WR includes sections SC at which power supplying section of the power substation switches. When the pantograph PG passes through the sections SC, power supply from the overhead wire WR is momentarily interrupted. Such an interruption of power supply may cause a precipitous change in physical quantities of the power circuit 100, and the precipitous change may lead to the occurrence of an abnormality. Thus, in order to detect such a precipitous change, detection of the groups of time-series data items TDS at a highest possible sampling frequency is desirable.

The detector 410 of FIG. 1 detects, at a sampling frequency equal to 1,000 Hz or greater, at least one output of the outputs from the transformers 411-416 of FIG. 3 that are the physical quantities relating to the operation of the power circuit 100. Different sampling frequencies may be employed for each group of time-series data items included in the groups of time-series data items TDS.

The tracking memory 440 of FIG. 1 is a volatile memory. In general, writing to a volatile memory can be performed at a higher speed than writing to a non-volatile memory. Thus, the writer 433 achieves exhaustive recording of the groups of time-series data items TDS in the tracking memory 440, while data amount of the groups of time-series data items TDS for a tracking period increases by improvement in the sampling frequency at which the detector 410 detects to 1,000 Hz or greater.

As illustrated in FIG. 1, the control device 400 includes a record holding power accumulator 450 that supplies power to the tracking memory 440. The record holding power accumulator 450 stores power supplied from the overhead wire WR and supplies the stored power to the tracking memory 440 as record holding power to be used by the tracking memory 440 that is volatile to hold in the work area the group of tracking data items RS for the tracking period. The record holding power accumulator 450 includes a capacitor.

The control device 400 further includes a control power accumulator 460 that is different from the record holding power accumulator 450 and supplies power to the CPU 430. Similarly to the record holding power accumulator 450, the control power accumulator 460 stores power supplied from the overhead wire WR and supplies the stored power to the CPU 430 as control power to be used by the CPU 430 to function as the controller 431, the abnormality detector 432, and the writer 433.

Hereinafter the sequential update processing performed by the writer 433 is specifically described with reference to FIG. 4.

Figure 4:
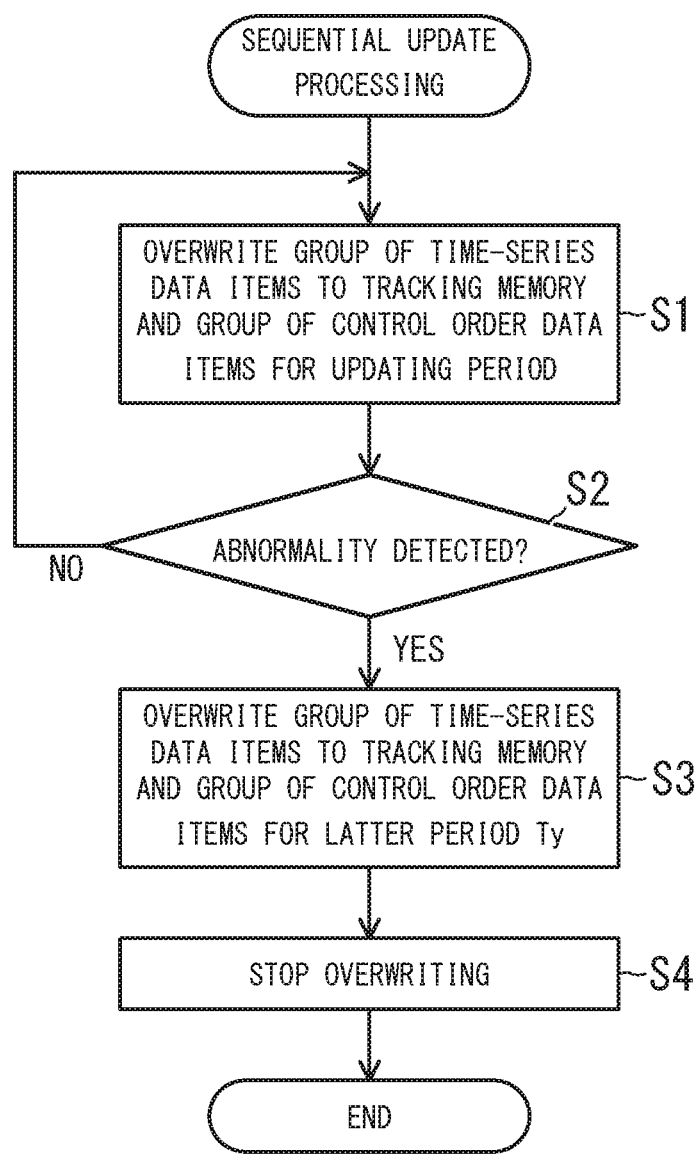
FIG. 4 is a flowchart of sequential update processing according to Embodiment 1.

As illustrated in FIG. 4, the writer 433 writes, during operation of the vehicle air-conditioning device 300, to the work area of the tracking memory 440 the latest group of tracking data items RS, that is, the latest groups of time-series data items TDS and the latest group of control order data items, for an updating period that is shorter than the tracking period (step S1).

Next, the writer 433 determines whether an abnormality is detected by the abnormality detector 432 (step S2), and when an abnormality is not detected (No in step S2), the processing returns to step S1. That is to say, the process in step S1 is repeatedly performed until an abnormality is detected.

This allows the tracking memory 440 to accumulate in the work area thereof the group of tracking data items RS for the tracking period. Upon completion of such accumulation, the group of tracking data items RS for the latest updating period is overwritten to the work area of the tracking memory 440 each time after performance of the process in step S1.

The content recorded in the work area of the tracking memory 440 is sequentially updated to the group of tracking data items RS for the latest tracking period by deleting from the work area of the tracking memory 440 the group of tracking data items RS for the oldest updating period each time after performance of overwriting.

When an abnormality is detected by the abnormality detector 432 (Yes in step S2), the writer 433 overwrites to the work area of the tracking memory 440 the groups of time-series data items TDS and the group of control order data items each being for the latest latter period Ty (step S3), stops overwriting (step S4), and ends the processing.

When the present processing ends after detection of an abnormality as described above, acquiring from the work area of the tracking memory 440 the groups of time-series data items TDS and the group of control order data items and indicating the data items using a graph enable checking, for each group of data items, the process leading to occurrence of the abnormality. This configuration is specifically described below with reference to FIG. 5.

Figure 5:
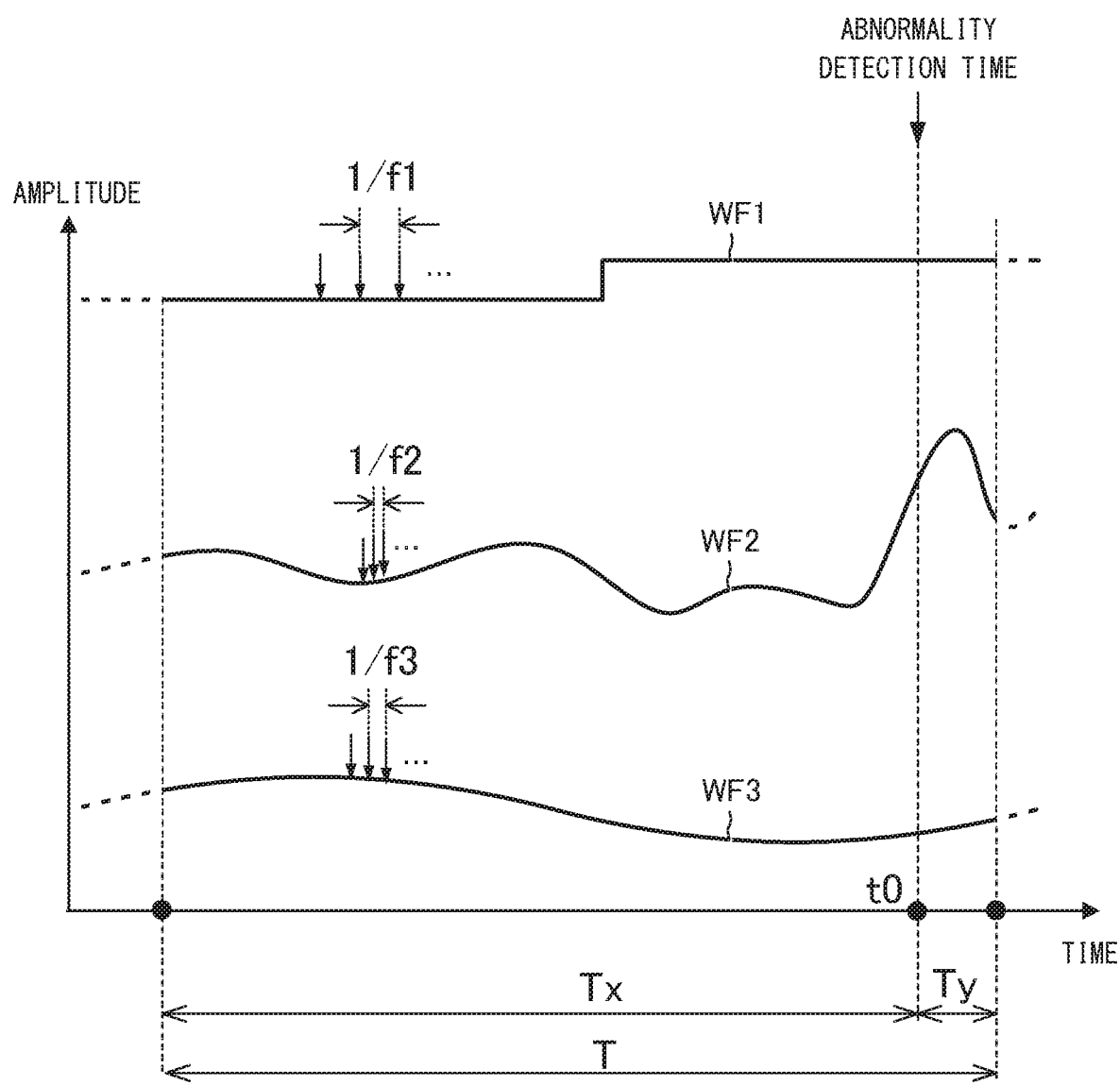
FIG. 5 is a schematic diagram illustrating waveforms of data recorded in a tracking memory according to Embodiment 1.

FIG. 5 illustrates three waveforms WF1, WF2, and WF3 as representative examples. The graphically represented waveform WF1 indicates a voltage signal included in the above-described control orders SC for switching on and off of the contactor 173 of FIG. 3. The graphically represented waveform WF2 indicates the time-series data items about the output voltage of the chopper circuit 130 of FIG. 3. The graphically represented waveform WF3 indicates time-series data items about the output current of the first inverter circuit 151 of FIG. 3.

As illustrated in FIG. 5, checking of the waveforms WF1, WF2, and WF3 can be achieved for a tracking period T including time t0 at which the abnormality occurs. That is to say, writing of data items for the latter period Ty in step S3 of FIG. 4 enables checking the physical quantities indicated by the waveforms WF1, WF2, and WF3 not only for the former period Tx that is a period until the abnormality occurs but also for the latter period Ty that is a predetermined period after the abnormality occurs.

The waveform WF1 is obtained by detecting at the sampling frequency of f1, the waveform WF2 is obtained by detecting at the sampling frequency of f2, and the waveform WF3 is obtained by detecting at the sampling frequency of f3. That is to say, the waveform WF1 includes data points arranged at 1/f1 sampling cycle intervals, the waveform WF2 includes data points arranged at 1/f2 sampling cycle intervals, and the waveform WF3 includes data points arranged at 1/f3 sampling cycle intervals.

Sampling frequencies employed for detection of the data items of the group of tracking data items RS may differ from one another as described above, and FIG. 5 illustrates a case of employing a configuration in which f2>f3>f1. In the present embodiment, sampling frequencies may be employed as the sampling frequencies f1, f2 and f3 as described above that are set higher than conventionally, and thus the waveforms WF1, WF2, and WF3 enable recognition of precipitous changes in the physical quantities.

Furthermore, detection values of the physical quantities included in the group of tracking data items RS are each assigned a time at which the corresponding physical quantity is detected, even when the group of tracking data items RS includes data items detected at different sampling frequencies. This enables checking, with the same time scale, as illustrated in FIG. 5, the waveforms WF1, WF2, and WF3 that are detected at different sampling frequencies.

Such configuration enables, when the waveform WF2 pulsates rapidly than the waveform WF3, for example, specifying the cause of an abnormality as the pulsation in output voltage of the chopper circuit 130 and addressing the abnormality by suppressing the pulsation, or the like.

According to the present embodiment as described above, employing a volatile memory as the tracking memory 440 enables the writer 433 to achieve writing to the tracking memory 440 of the groups of time-series data items TDS and the group of control order data items with a higher speed than when employing a non-volatile memory. Thus, even when the sampling frequency for detecting the physical quantities is set high, the detector 410 can perform exhaustive writing of the groups of time-series data items TDS and the group of control order data items to the tracking memory 440.

That is to say, recording of the physical quantities relating to the operation of the vehicle air-conditioning device 300 at a high sampling frequency can be achieved. Specifically, the sampling frequency employed in detecting physical quantities by the detector 410 can be increased at a frequency of at least 1,000 Hz. Such configuration enables recognition of precipitously changes in the physical quantities, thereby increasing detection accuracy of the cause of an abnormality.

Furthermore, the record holding power accumulator 450 supplies the record holding power to the tracking memory 440. Such configuration lowers the possibility of disappearance of the groups of time-series data items TDS and the group of control order data items recorded in the work area of the tracking memory 440, even upon interruption or stoppage of power supply from the overhead wire WR that occurs when the pantograph PG passes through the sections SC.

Notably, the record holding power accumulator 450 supplies power only to the tracking memory 440. That is to say, another accumulator, the control power accumulator 460, is arranged to supply to the CPU 430 power to be used for writing by the writer 433 to the tracking memory 440. Due to such configuration, electricity stored in the record holding power accumulator 450 does not easily decrease.

Such configuration enables holding the content recorded in the work area of the tracking memory 440 for a few days after power supply from the overhead wire WR stops, and further enables checking of the process leading to an abnormality at an appropriate time a few days later. Checking the content recorded in the tracking memory 440 during operation of the railroad vehicle is sometimes difficult, and thus enabling flexible adjustment of the timing for checking the content recorded in the tracking memory 440 has significance.

Embodiment 2

Although the groups of time-series data items TDS generated by the detector 410 are directly transmitted to the writer 433 in Embodiment 1 described above, the writer 433 may acquire the groups of time-series data items TDS via a relay memory that functions as a buffer. A specific example of such a configuration is described below. In the following descriptions, illustration and description of the same structural elements as those in Embodiment 1 are partially omitted.

Figure 6:
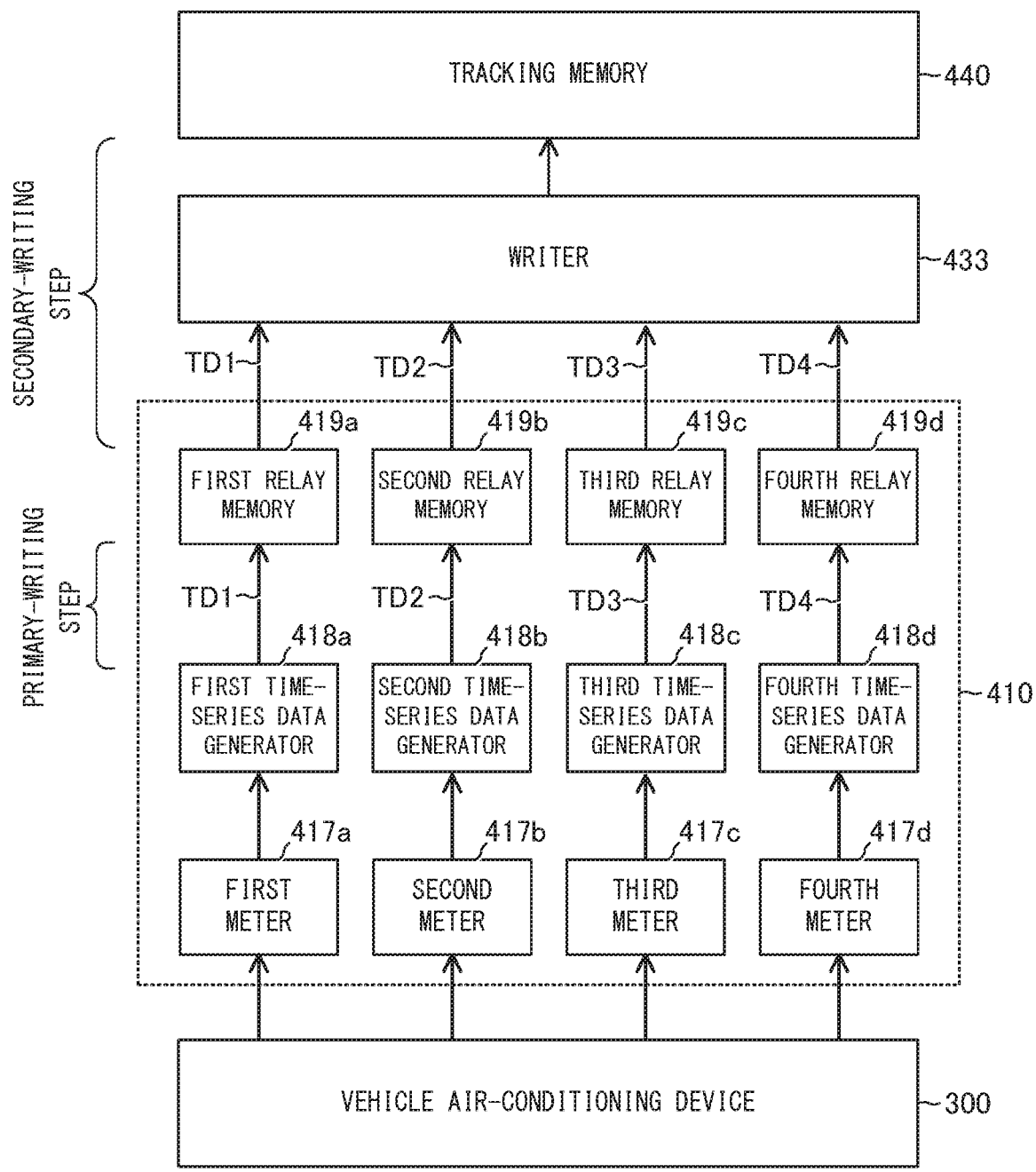
FIG. 6 is a schematic diagram illustrating a main part of a control device according to Embodiment 2.

As illustrated in FIG. 6, a detector 410 of the present embodiment includes a first meter 417a, a second meter 417b, a third meter 417c, and a fourth meter 417d that detect, from the vehicle air-conditioning device 300, the physical quantities that differ from one another and relate to an operation of the vehicle air-conditioning device 300.

Specifically, the first meter 417a is the transformer 412 of FIG. 3, the second meter 417b is the transformer 414 of FIG. 3, the third meter 417c is the transformer 415 of FIG. 3, and the fourth meter 417d is the transformer 416 of FIG. 3.

The detector 410 further includes a first time-series data generator 418a, a second time-series data generator 418b, a third time-series data generator 418c, and a fourth time-series data generator 418d. These time-series data generators function as a plurality of time-series data generation means for generating time-series data items of physical quantities different from one another. Each of the first time-series data generator 418a to the fourth time-series data generator 418d includes a separate CPU.

The first time-series data generator 418a generates a first time-series data item TD1 by sampling values detected by the first meter 417a. The second time-series data generator 418b generates a second time-series data item TD2 by sampling values detected by the second meter 417b. The third time-series data generator 418c generates a third time-series data item TD3 by sampling values detected by the third meter 417c. The fourth time-series data generator 418d generates a fourth time-series data item TD4 by sampling values detected by the fourth meter 417d.

Different sampling frequencies may be employed for obtaining the first time-series data item TD1 to the fourth time-series data item TD4.

The detector 410 further includes a first relay memory 419a provided for the first time-series data generator 418a, a second relay memory 419b provided for the second time-series data generator 418b, a third relay memory 419c provided for the third time-series data generator 418c, and a fourth relay memory 419d provided for the fourth time-series data generator 418d.

Each of the first relay memory 419a to the fourth relay memory 419d includes a Dual-Ported Random Access Memory (DPRAM) that functions as a volatile and interactive memory for achieving performance of both writing and reading at the same time.

The first time-series data generator 418a writes a group of the first time-series data items TD1 generated thereby to the first relay memory 419a. The second time-series data generator 418b writes a group of the second time-series data items TD2 generated thereby to the second relay memory 419b. The third time-series data generator 418c writes a group of the third time-series data items TD3 generated thereby to the third relay memory 419c. The fourth time-series data generator 418d writes a group of the fourth time-series data items TD4 generated thereby to the fourth relay memory 419d.

The writer 433 reads, from the first relay memory 419a to the fourth relay memory 419d, the group of the first time-series data items TD1 to the group of the fourth time-series data items TD4. Then, the writer 433 writes the read time-series data items to the common tracking memory 440. Although not illustrated in FIG. 6, the writer 433 writes to the tracking memory 440 the group of control order data items of FIG. 1 indicating a plurality of control orders CS, similarly to Embodiment 1.

As described above, sequential update processing of updating the content recorded in the tracking memory 440 of the present embodiment includes a primary-writing step of writing by the first time-series data generator 418a to the fourth time-series data generator 418d, and a secondary-writing step of performing, by the writer 433, reading and writing.

Hereinafter the primary-writing step and the secondary-writing step are specifically described with reference to FIG. 7. An operation of the first time-series data generator 418a is described as an example of the primary-writing step.

Figure 7:
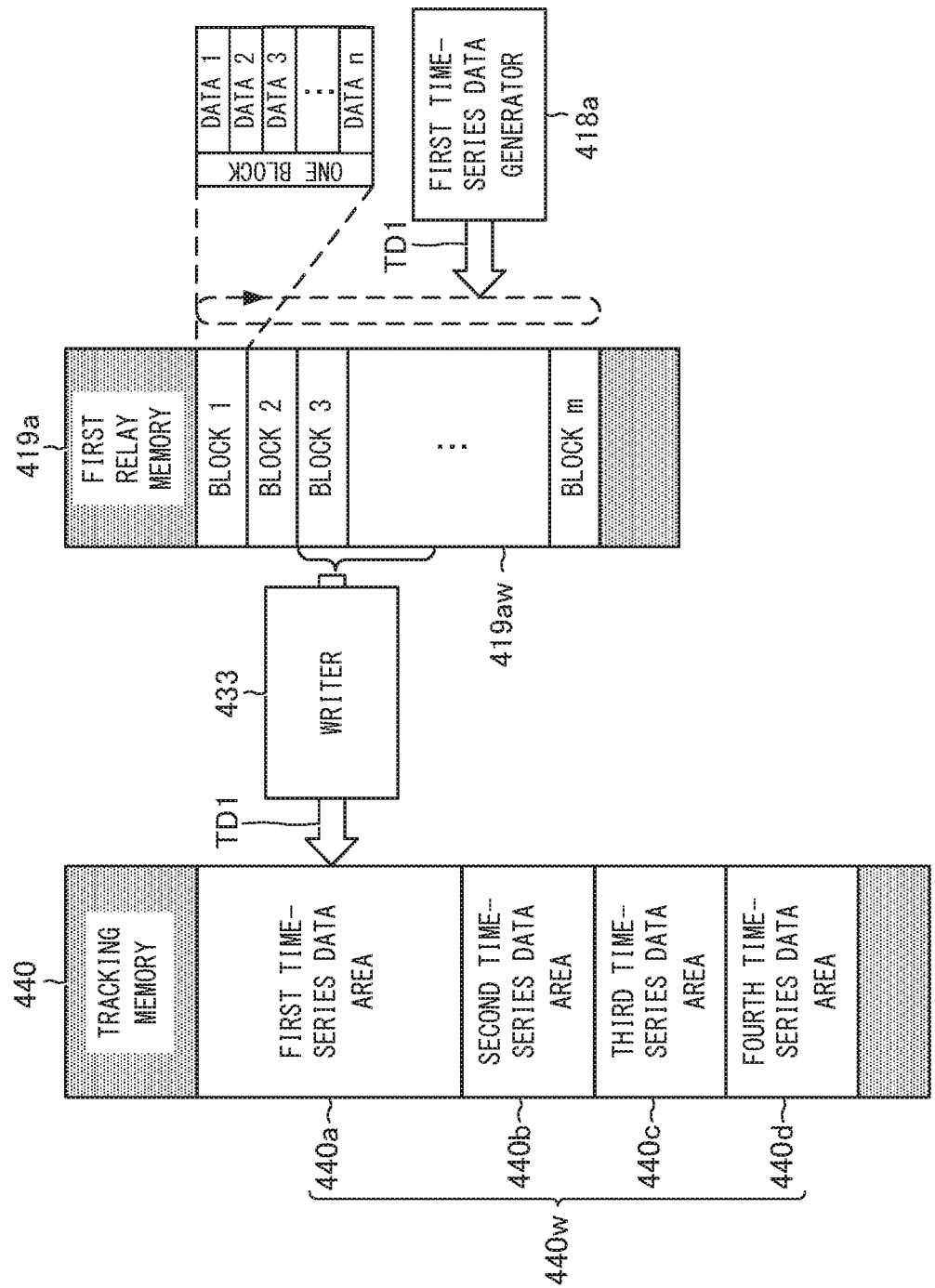
FIG. 7 is a schematic diagram illustrating a storage of a first relay memory and a storage of a tracking memory according to Embodiment 2.

As illustrated in FIG. 7, the first relay memory 419a includes a first relay work area 419aw to which the group of the first time-series data items TD1 is written. The first relay work area 419aw is divided into a plurality of block areas. Each of the block areas can store the first time-series data item TD1 having a data amount for one block, that is, for a plurality of data points.

Each of the second relay memory 419b to the fourth relay memory 419d of FIG. 6 has a configuration similar to that of the first relay memory 419a.

In the primary-writing step, the first time-series data generator 418a sequentially writes the first time-series data items TD1 to the first relay work area 419aw in block units. The block to which the data item is written is selected cyclically from among the plurality of block areas included in the first relay work area 419aw. After a cycle of writing, overwriting of the first time-series data items TD1 to the block areas starts.

The tracking memory 440 includes a work area 440w for the groups of time-series data items to which the group of the first time-series data items TD1 to the group of the fourth time-series data items TD4 are written. Although not illustrated in FIG. 7, the tracking memory 440 further includes a work area for the group of control order data items to which the group of control order data items indicating the plurality of control orders CS of FIG. 1 is written.

The work area 440w for the groups of time-series data items is divided into a first time-series data area 440a to which the group of the first time-series data items TD1 is written, a second time-series data area 440b to which the group of the second time-series data items TD2 is written, a third time-series data area 440c to which the group of the third time-series data items TD3 is written, and a fourth time-series data area 440d to which the group of the fourth time-series data items TD4 is written.

In the secondary-writing step, the writer 433 reads, from the first relay work area 419aw of the first relay memory 419a, the first time-series data items TD1 for a plurality of the blocks at one time, and overwrites the read first time-series data items TD1 to the first time-series data area 440a of the tracking memory 440.

The writer 433 also performs writing from the second relay memory 419b to the fourth relay memory 419d of FIG. 6 to a second time-series data area 440b to a fourth time-series data area 440d of FIG. 7. Such configuration is specifically described with reference to FIG. 8.

Figure 8:
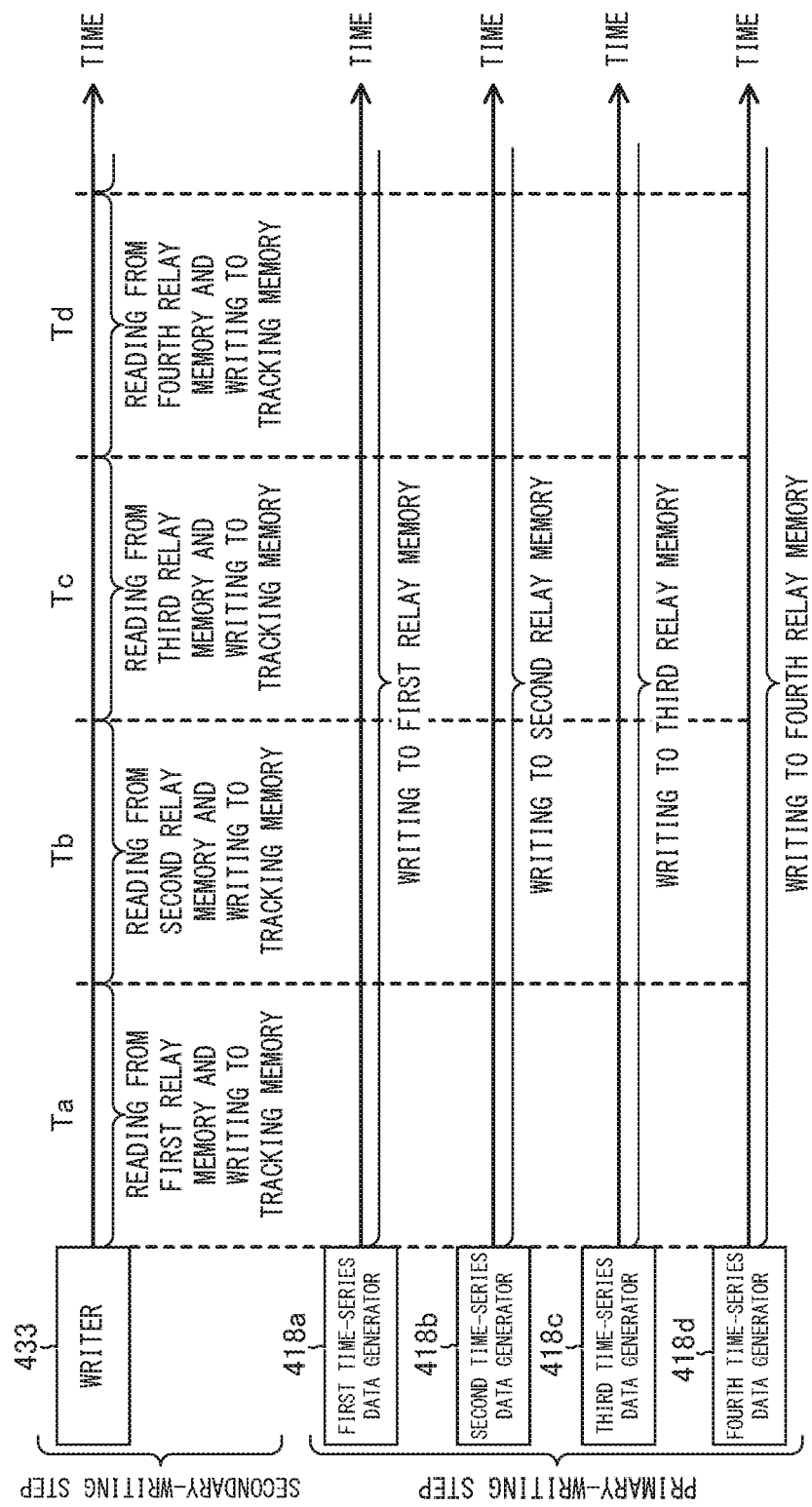
FIG. 8 is a timing chart illustrating operations performed by the control device according to Embodiment 2.

As illustrated in FIG. 8, in the primary-writing step, each of the first time-series data generator 418a to the fourth time-series data generator 418d continues writing to the first relay memory 419a to the fourth relay memory 419d. The writing in the primary-writing step is continuously performed until the abnormality detector 432 of FIG. 1 detects an abnormality.

The primary-writing step and the secondary-writing step are performed in parallel. In the secondary-writing step, the writer 433 firstly reads, during a period Ta, from the first relay memory 419a the first time-series data items TD1 for a plurality of the blocks having an data amount for an updating period, and then overwrites the first time-series data items TD1 for the plurality of the blocks to the first time-series data area 440a of the tracking memory 440.

Next, the writer 433 reads, during a period Tb, from the second relay memory 419b the second time-series data items TD2 for a plurality of the blocks having an data amount for the updating period, and then overwrites the second time-series data items TD2 for the plurality of the blocks to the second time-series data area 440b of the tracking memory 440.

Next, the writer 433 reads, during a period Tc, from the third relay memory 419c the third time-series data items TD3 for a plurality of the blocks having an data amount for the updating period, and then overwrites the third time-series data items TD3 for the plurality of the blocks to the third time-series data area 440c of the tracking memory 440.

Next, the writer 433 reads, during a period Td, from the fourth relay memory 419d the fourth time-series data items TD4 for a plurality of the blocks having an data amount for the updating period, and then overwrites the fourth time-series data items TD4 for the plurality of the blocks the fourth time-series data area 440d of the tracking memory 440.

The reading and writing operations for the period Ta to the period Td described above are continued periodically as one cycle. This repetition is continued without interruption until the abnormality detector 432 of FIG. 1 detects an abnormality.

That is to say, the writer 433 sequentially overwrites the read first time-series data items TD1 to the fourth time-series data items TD4 to the tracking memory 440 while cyclically switching a reading source among the first relay memory 419a to the fourth relay memory 419d. Thus, the content recorded in the tracking memory 440 is sequentially updated to the first time-series data items TD1 to the fourth time-series data items TD4 for the latest tracking period.

Here, the reading from the first relay memory 419a to the fourth relay memory 419d and the writing of the read data items to the tracking memory 440 each performed by the writer 433 are performed with a faster speed and a larger amount of data per unit time than in performing each of the writings to the first relay memory 419a to the fourth relay memory 419d. The "speed" indicates an amount of data per unit time.

Specifically, the cycle of FIG. 7 in which writings by the first time-series data generator 418a to all the block areas of the first relay work area 419aw are completed is at least 3 times as long as one cycle (=Ta+Tb+Tc+Td) of the secondary-writing step of FIG. 8. The same applies to each cycle for the second relay memory 419b to the fourth relay memory 419d in which writings to all the block areas are completed.

Such configuration allows the writer 433 to perform exhaustive writing to the tracking memory 440 of the group of the first time-series data items TD1 to the group of the fourth time-series data items TD4 that are generated by the first time-series data generator 418a to the fourth time-series data generator 418d.

As described above, according to the present embodiment, the writer 433 acquires the first time-series data items TD1 to the fourth time-series data items TD4 via the first relay memory 419a to the fourth relay memory 419d that function as buffers, and thus exhaustive consolidation in one memory (the tracking memory 440) of the group of the first time-series data items TD1 to the group of the fourth time-series data items TD4 that are output in parallel can be achieved.

Notably, writings to the tracking memory 440 by the first time-series data generator 418a to the fourth time-series data generator 418d cannot be performed at the same time. Thus, a configuration that does not include the first relay memory 419a to the fourth relay memory 419d and the writer 433 has difficulty in performing exhaustive consolidation in one memory (the tracking memory 440) of the group of the first time-series data item TD1 to the group of the fourth time-series data item TD4 at increased sampling frequencies.

Further, according to the present embodiment, each of the first relay memory 419a to the fourth relay memory 419d includes a dual-ported memory that enables performance of both writing and reading at the same time. Thus, the reading from the first relay memory 419a by the writer 433 within the period Ta can be achieved without interruption of the writing by the first time-series data generator 418a to the first relay memory 419a. The same applies to the periods Tb–Td.

Such configuration allows the first time-series data generator 418a to the fourth time-series data generator 418d to output the first time-series data items TD1 to the fourth time-series data items TD4 at high sampling frequencies, and also allows the writer 433 to perform exhaustive consolidation of these data items in the tracking memory 440.

Embodiment 3

Although the group of tracking data items RS is stored in the tracking memory 440 in Embodiments 1 and 2 described above, a configuration for transmitting to the exterior the group of tracking data items RS stored in the tracking memory 440 may be employed. Such configuration is specifically described below. In the following descriptions, illustration and description of the same structural elements as those in Embodiments 1 and 2 are partially omitted.

Figure 9:
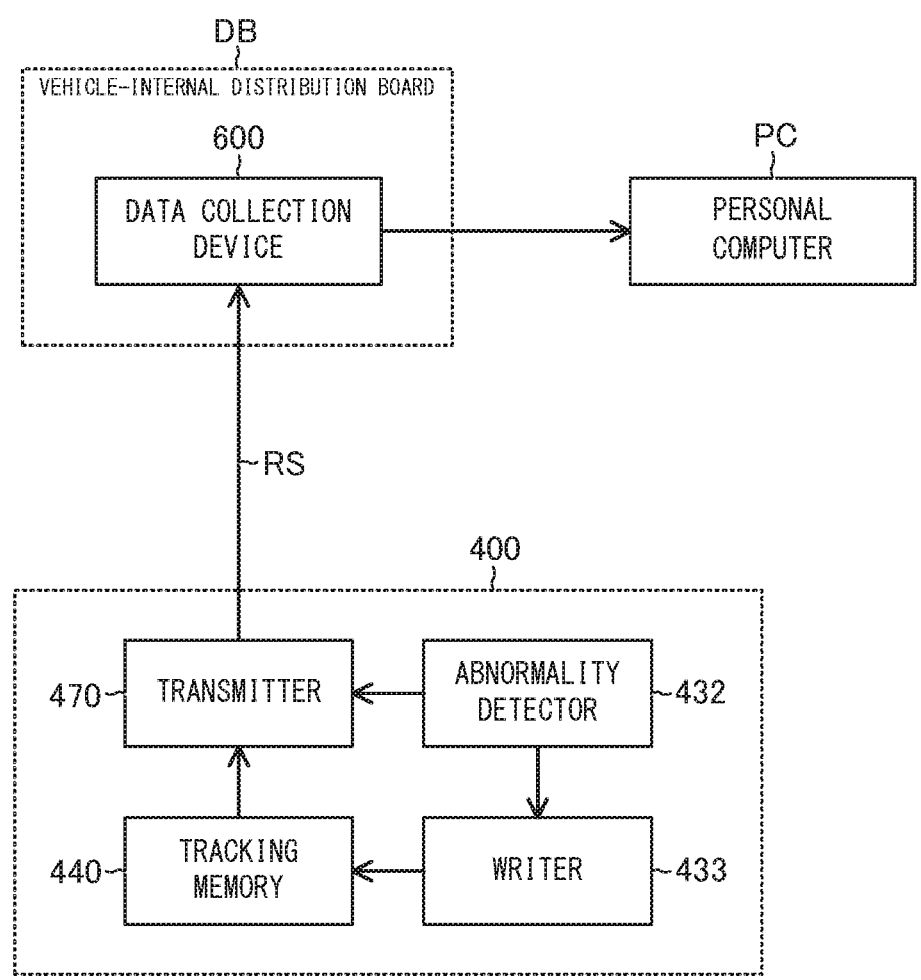
FIG. 9 is a schematic diagram illustrating a transmitter and a data collection device according to Embodiment 3.

As illustrated in FIG. 9, a control device 400 of the present embodiment includes a transmitter 470 that functions as transmission means for transmitting to the exterior the group of tracking data items RS recorded in the tracking memory 440. The CPU 430 of FIG. 1 executes the control program 421 to achieve the function of the transmitter 470.

When the abnormality detector 432 detects an abnormality, the transmitter 470 transmits, to the external data collection device 600, the group of tracking data items RS for the tracking period T recorded in the work area of the tracking memory 440.

The data collection device 600 is arranged on a vehicle-internal distribution board DB in the railroad vehicle. Thus, a user can easily access the vehicle-internal distribution board DB. Furthermore, the user can acquire by a personal computer PC from the data collection device 600 the group of tracking data items RS and check the waveforms of the data items of the group of tracking data items RS on the personal computer PC.

The writer 433 of the control device 400 restarts overwriting of the group of tracking data items RS to the work area of the tracking memory 440 after the transmitter 470 transmits to the data collection device 600 the tracking data RS for the tracking period T.

According to the present embodiment, overwriting of new group of tracking data items RS to the tracking memory 440 restarts even after the abnormality detector 432 detects an abnormality by storing in the data collection device 600 the group of tracking data items RS recorded in the tracking memory 440. Thus, even in a case with a high frequency of the occurrence of abnormalities, acquisition of the group of tracking data items RS for tracking each abnormality can be achieved.

The record holding power accumulator 450 of FIG. 1 serves to stably hold the group of tracking data items RS in the tracking memory 440 until completion of transmission of the group of tracking data items RS to the data collection device 600.

Embodiment 4

Embodiment 3 described above, by transmitting the group of tracking data items RS recorded in the tracking memory 440 to the exterior, enables storing of the group of tracking data items RS for a plurality of the tracking periods T. However, the group of tracking data items RS for a plurality of the tracking periods T may be stored in the tracking memory 440 when the tracking memory 440 has a large storage capacity. An example of such configuration is specifically described below.

Figure 10:
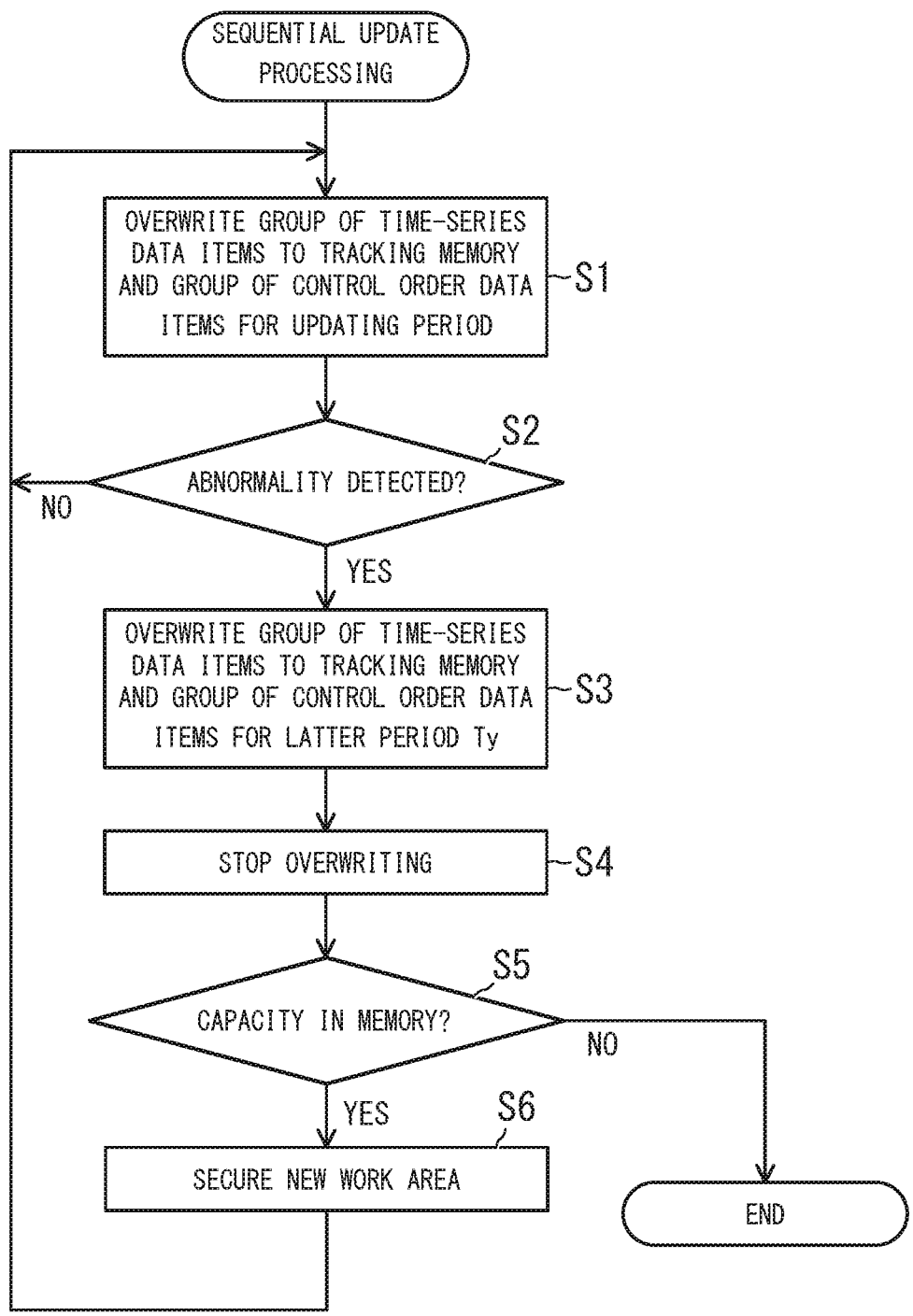
FIG. 10 is a flowchart of sequential update processing according to Embodiment 4.

In the present embodiment, the writer 433 determines, after step S4 of FIG. 4 for sequential update processing, whether the tracking memory 440 has a storage capacity for recording the group of tracking data items RS for another tracking period T (step S5), as illustrated in FIG. 10. When the tracking memory 440 does not have a storage capacity for recording (No in step S5), the writer 433 ends the processing.

When the tracking memory 440 has room for recording the group of tracking data items RS for the another tracking period T (Yes in step S5), the writer 433 secures in the storage of the tracking memory 440 a new work area for storing the group of tracking data items RS for the another tracking period T (step S6). Then, the processing returns to step S1, and the writer 433 writes the group of tracking data items RS to the new work area secured in step S6.

According to the present embodiment, overwriting of new group of tracking data items RS to the tracking memory 440 restarts, even after the abnormality detector 432 detects an abnormality, by securing a new work area in the tracking memory 440. Thus, even in a case with a high frequency of the occurrence of the abnormalities, storing in the tracking memory 440 of the group of tracking data items RS for tracking each abnormality can be achieved.

While embodiments according to the present disclosure are described above, the present disclosure is not limited to the above-described embodiments, and modifications as described below may be made.

Although voltages and currents are detected as physical quantities relating to the operation of the vehicle air-conditioning device 300 in Embodiment 1 described above, temperatures may be detected. Furthermore, although the physical quantities relating to the operation of the vehicle air-conditioning device 300 are detected from the power circuit 100 in Embodiment 1 described above, the physical quantities may be detected also from the refrigeration cycle device 200.

Furthermore, data items included in the group of tracking data items RS are not limited to the above-described examples. For example, control order data item indicating an operation mode of the refrigeration cycle device 200, time-series data item indicating temperatures of the outdoor heat exchanger 220 and the indoor heat exchanger 240 of the refrigeration cycle device 200, time-series data item indicating a temperature in the railroad vehicle, time-series data item indicating an external temperature, and time-series data item indicating temperatures of various switching elements included in the power circuit 100 may be employed in the tracking data items RS.

Furthermore, although the abnormality detector 432 detects an abnormality based on the groups of time-series data items TDS in Embodiment 1 described above, detection of an abnormality in the vehicle air-conditioning device 300 and detection of physical quantities for tracking the operation of the vehicle air-conditioning device 300 may be performed by different parts.

In Embodiment 3, the transmitter 470 transmits to the data collection device 600 the group of tracking data items RS recorded in the tracking memory 440 upon detection of an abnormality in the vehicle air-conditioning device 300. However, a configuration in which the transmitter 470 transmits, upon receipt of a transmission request from the data collection device 600 at a freely-selected time to transmit the group of tracking data items RS, to the data collection device 600 the group of tracking data items RS recorded in the tracking memory 440 at the time of the receipt of the request may be employed. Furthermore, a configuration in which the transmitter 470 periodically transmits to the data collection device 600 the group of tracking data items RS recorded in the tracking memory 440 may be employed.

Although the vehicle air-conditioning device 300 is the target device that is a tracking target in Embodiments 1-4 described above, the target device is not limited to the vehicle air-conditioning device 300. The target device may be a freely-selected device installed in the railroad vehicle.

Installing the control program 421 of FIG. 1 in a computer enables the computer to function as the control device 400. The control program 421 may be distributed via a communication network, or may be distributed by storing the program in a computer-readable recording medium such as an optical disk, a magnetic disk, a magnet-optical disk, and a flash memory.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

This application claims the benefit of Japanese Patent Application No. 2017-204453, filed on Oct. 23, 2017, the entire disclosure of which is incorporated by reference herein.

INDUSTRIAL APPLICABILITY

A recording device for a railroad vehicle, an air conditioning apparatus for a railroad vehicle, and a recording method for a railroad vehicle according to the present disclosure are suitable for recording physical quantities relating to operation of a target device installed in a railroad vehicle.

REFERENCE SIGNS LIST

100 Power circuit
110 Rectifier
120 Input capacitor
130 Chopper circuit
140 Output capacitor
151 First inverter circuit
152 Second inverter circuit
153 Third inverter circuit
160 Contactor
171 Contactor
172 Current-limiting resistor
173 Contactor
174 Alternating current reactor
200 Refrigeration cycle device
200a First refrigeration cycle
200b Second refrigeration cycle
211 First compressor
212 Second compressor
220 Outdoor heat exchanger
231 First expander
232 Second expander
240 Indoor heat exchanger
251 First gas-liquid separator
252 Second gas-liquid separator
260 Outdoor fan
270 Indoor fan
300 Vehicle air-conditioning device (Target device)
400 Control device (Recording device for railroad vehicle)
410 Detector (Detection means)
411, 412,413, 414, 415, 416 Transformer
417a First meter
417b Second meter
417c Third meter
417d Fourth meter
418a First time-series data generator (Time-series data generation means)
418b Second time-series data generator (Time-series data generation means)
418c Third time-series data generator (Time-series data generation means)
418d Fourth time-series data generator (Time-series data generation means)
419a First relay memory (Relay memory)
419aw First relay work area
419b Second relay memory (Relay memory)
419c Third relay memory (Relay memory)
419d Fourth relay memory (Relay memory)
420 Auxiliary memory
421 Control program
430 CPU
431 Controller
432 Abnormality detector (Abnormality detection means)
433 Writer (Writing means)
440 Tracking memory
440a First time-series data area
440b Second time-series data area
440c Third time-series data area
440d Fourth time-series data area
440w Work area for group of time-series data items (Work area)
450 Record holding power accumulator
460 Control power accumulator
470 Transmitter (Transmission means)
500 Air conditioning apparatus
600 Data collection device
WR Overhead wire
SC Section
PG Pantograph
TR Transformer
TDS Groups of time-series data items
TD1 First time-series data item
TD2 Second time-series data item
TD3 Third time-series data item
TD4 Fourth time-series data item
CS Control order
RS Group of tracking data items
WF1, WF2, WF3 Waveform
DB Vehicle-internal distribution board
PC Personal computer

The invention claimed is:

1. A recording device for a railroad vehicle, comprising:
a detector to repeatedly detect, from an air-conditioning device of the railroad vehicle that performs air conditioning of a passenger compartment of the railroad vehicle, a physical quantity relating to an operation of the air-conditioning device at a predetermined sampling frequency to generate time-series data indicating detection values of the physical quantity in time series;

a controller to control the air-conditioning device by outputting control orders to the air-conditioning device based on the time-series data;

an abnormality detector to detect occurrence of an abnormality in the air-conditioning device;

a tracking memory that is volatile and has a work area to which the time-series data for a predetermined tracking period and control order data for the tracking period are writable, the control order data indicating the control orders;

a record holding power accumulator to store power supplied from an overhead wire and to supply the stored power as record holding power to the tracking memory, the record holding power being used by the tracking memory to hold the time-series data for the tracking period and the control order data for the tracking period in the work area; and a writer to (i) sequentially overwrite the time-series data and the control order data to the work area of the tracking memory to sequentially update content recorded in the work area to the time-series data for a latest tracking period and the control order data for the latest tracking period and (ii) when the abnormality detector detects occurrence of an abnormality in the air-conditioning device, stop overwriting of the time-series data and the control order data to the work area, determine whether the tracking memory has additional capacity different from the work area, and in response to determining that the tracking memory has additional capacity different from the work area, secure a new work area in the tracking memory different from the work area, and sequentially overwrite new time-series data and new control order data to the new work area of the tracking memory to sequentially update content recorded in the new work area to time-series data for a next latest tracking period and control order data for the next latest tracking period.

2. The recording device according to claim 1, wherein the detector comprises:

a plurality of time-series data generators to detect a plurality of physical quantities to generate the time-series data of the physical quantities; and a plurality of relay memories, each volatile and provided for a corresponding one of the plurality of time-series data generators, each of the plurality of time-series data generators writes the time-series data generated thereby to the corresponding relay memory provided therefor, and the writer, in parallel to the writing by the plurality of time-series data generators of the time-series data to the plurality of relay memories, sequentially updates content recorded in the tracking memory to the time-series data of all of the physical quantities for the latest tracking period and the control order data for the latest tracking period by (i) reading the time-series data from the plurality of relay memories while switching a reading source among the plurality of relay memories, (ii) sequentially overwriting the read time-series data to the tracking memory, and (iii) sequentially overwriting the control order data to the tracking memory.

3. The recording device according to claim 1, further comprising a transmitter to, when the abnormality detector detects occurrence of an abnormality in the air-conditioning device, transmit to an exterior the time-series data for the tracking period and the control order data for the tracking period that are recorded in the work area of the tracking memory.

4. The recording device according to claim 3, wherein the writer restarts the overwriting of the time-series data and the control order data to the work area after the transmitter transmits to the exterior the time-series data for the tracking period and the control order data for the tracking period.

* * * * *